United States Patent
Yang et al.

(10) Patent No.: US 6,750,504 B2
(45) Date of Patent: Jun. 15, 2004

(54) LOW VOLTAGE SINGLE-POLY FLASH MEMORY CELL AND ARRAY

(75) Inventors: Ching-Sung Yang, Chang-Hua Hsien (TW); Shih-Jye Shen, Hsin-Chu (TW); Wei-Zhe Wong, Tai-Nan (TW); Ching-Hsiang Hsu, Hsin-Chu (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 10/063,444

(22) Filed: Apr. 24, 2002

(65) Prior Publication Data

US 2003/0201487 A1 Oct. 30, 2003

(51) Int. Cl.[7] ............................................. H01L 29/72
(52) U.S. Cl. ...................... 257/315; 257/316; 257/318; 365/185
(58) Field of Search ................................. 257/315, 316, 257/318; 365/185

(56) References Cited

U.S. PATENT DOCUMENTS 6,418,060 B1 * 7/2002 Yang et al. ............ 365/185.28

* cited by examiner

*Primary Examiner*—Edward Wojciechowicz
(74) *Attorney, Agent, or Firm*—Winston Hsu

(57) ABSTRACT

A low voltage single-poly flash memory cell includes a first ion well of a first conductivity type, a second ion well of a second conductivity type formed on the first ion well, a charge storage layer comprising a first insulating layer, a trapping layer, and a second insulating layer, located on the second ion well, a gate located on the charge storage layer, a sourceand a drain of the second conductivity type located in two sides of the charge storage layer, and an ion doped region of the first conductivity type formed in the second ion well and under and surrounding the source and at least a portion of a bottom of the first insulating layer.

20 Claims, 7 Drawing Sheets

LOW VOLTAGE SINGLE-POLY FLASH MEMORY CELL AND ARRAY

BACKGROUND OF INVENTION

1. Field of the Invention

The present invention relates to a memory cell and array, and more particularly, to a flash memory cell and array.

2. Description of the Prior Art

In non-volatile memories, flash memory cells can be programmed by various types of operating methods such as channel hot electron injection and Fowler-Nordheim (FN) tunneling. During a programming operation of the flash memory cell, electrons are driven into a floating gate to increase a critical voltage of the flash memory cell. During an erasing operation of the memory cell, electrons are drawn from the floating gate to decrease the critical voltage of the flash memory cell.

In order to program and erase a staked gate flash memory cell, carriers pass through an insulator potential barrier built from the floating gate and terminals of other devices. Therefore, the electrons are conducted within an oxide layer in the stacked gate flash memory cell. Please refer to FIG. 1. FIG. 1 is a schematic diagram illustrating a hot electron injection mode of a conventional flash memory cell 10. A proper positive voltage is applied to a control gate 12 and a drain 14 of the flash memory cell 10 to open the flash memory cell 10. At this time, the flash memory cell 10 is in a high drain voltage state, and carriers in a channel of the flash memory cell 10 eject from a source 16 to the drain 14 and the carriers are sped up at the drain 14 by a high channel electric field. As long as the carriers enter into a high electric field region, the carriers will be sped up to form a series of collisions. After the collision between the carriers and silicon lattices, electron-hole pairs are generated, and then the electron-hole pairs collide again by speeding up from the electric field. Therefore, a part of the carriers with high kinetic energy eject through the silicon oxide layer 18 and into the floating gate 20 so as to store the carriers in the floating gate 20.

However, the flash memory cell 10 has to be opened when the flash memory cell 10 is programmed in the hot electron injection mode for storing information. Therefore, a channel current in the channel of the flash memory cell 10 is generated so as to dissipate power of the flash memory cell 10.

In order to solve the above-mentioned power consumption problem, the flash memory cell can be programmed by using the FN tunneling mode. Please refer to FIG. 2. FIG. 2 is a cross-sectional diagram illustrating the FN tunneling mode of a conventional flash memory cell 30. The flash memory cell 30 comprises a deep P-well 26 utilized as a substrate of the flash memory cell 30, an N-well 28 formed on the deep P-well 26, a gate structure including a control gate 34, a floating gate 36, and a silicon oxide layer 38 from top to bottom, and a source 41 and a drain 32 formed in the N-well 28. The flash memory cell 30 further comprises a P-type ion doped region 42 formed in the N-well 28 and under and surrounding the source 41 and at least a portion of a bottom of the gate oxide layer 38, a metal contact $V_S$ penetrating through the source 41 and electrically connected to the source 41 and the P-type ion doped region 42, and another metal contact $V_D$ electrically connected to the drain 32. In addition, the metal contact $V_S$ can only be electrically connected to the source 41 and the P-type ion doped region 42, and does not penetrate through the source 41. When the flash memory cell 30 is programmed, electrons 40 in a channel of the flash memory cell 30 are ejected into the floating gate 36 through the gate oxide layer 38.

A flash memory array composed of a plurality of the above flash memory cells 30 shown in FIG. 2 is shown in FIG. 3A and FIG. 3B. FIG. 3A is a cross-sectional diagram illustrating a bit line connection mode of a conventional flash memory cell. FIG. 3B is a corresponding circuit diagram of the flash memory cell shown in FIG. 3A. Please refer to FIG. 3A. All of the flash memory cells 30 are built in an N-well 11. When a selected flash memory cells 30 is programmed, a power supplied from a bit line 13 affects the other flash memory cells 30 which connected to the same bit line 30. For example, when 5 Volts is applied to the bit line 13, drains (which are connected to the N-well 11) of the other flash memory cells 30 have a voltage of slightly less than 5 Volts. This forms M−1 interferences in a selected sector and M*P/E cycle times*(N−1) in the other sectors if the flash memory has N sectors, and each of the sectors has M word lines. That is, M is equal to the number of the flash memory cells. The cycle times means average interferences in each sector when the flash memory cell is programmed. Therefore, the total programming interferences of the bit line are M*P/E cycle times* (N−1)+(M−1) during the period when the flash memory cells 30 are programmed.

Similarly, erasing interferences of the bit line occur when the flash memory cells 30 are erased. However, the flash memory cells 30 of a whole sector are erased once, not one by one. When 8 Volts is applied to a drain 32 of the flash memory cell 30,the whole N-well 11 has a voltage of about 8 Volts. Therefore, the erasing interferences of the other sectors are P/E cycle times*(N−1).

The above-mentioned programming and erasing interferences influence the information storage capability of the flash memory cell, and cause information to be lost very easily. In addition, connection between a source and a P-type ion doped region (i.e. a shallow P-well) 15 of each flash memory cell 30 by the bit line 13 forms a parasitic capacitance 17 at the source of the flash memory cell 30, as shown in FIG. 3B. Therefore, the parasitic capacitance 17 burdens the bit line 13 and thus lowers the reading speed when the flash memory cell 30 is read.

SUMMARY OF INVENTION

It is therefore a primary objective of the claimed invention to provide a low voltage single-poly flash memory cell and array to solve the problems of high power consumption and high operating voltage of the conventional flash memory cell. Moreover, the claimed invention utilizes only one polysilicon layer, which is different from the stacked gate of the conventional flash memory cell, so as to simplify the fabrication process.

It is another object of the claimed invention to provide a flash memory cell having a divided bit line to prevent the above overloading of the bit line from being generated.

It is another object of the claimed invention to provide another flash memory cell having a divided bit line to reduce interferences efficiently when the flash memory cell is programmed or erased.

According to the claimed invention, a low voltage single-poly flash memory cell includes a first ion well of a first conductivity type, a second ion well of a second conductivity type formed on the first ion well, a charge storage layer including a first insulating layer, a trapping layer, and a second insulating layer, located on the second ion well, a gate located on the charge storage layer, a source of the second conductivity type located in the second ion well and being in contact with the charge storage layer, an ion doped region of the first conductivity type formed in the second ion well and under and surrounding the source and at least a portion of a bottom of the first insulating layer, and a drain of the second conductivity type located in the second ion well and being in contact with the ion doped region and the charge layer.

According to the claimed invention, another low voltage single-poly flash memory cell includes a first ion well of a first conductivity type, a second ion well of a second conductivity type formed on the first ion well, a third ion well of the first conductivity type formed on the second ion well, a charge storage layer comprising a first insulating layer, a trapping layer, and a second insulating layer, located on the third ion well, a gate located on the charge storage layer, a source of the second conductivity type located in the third ion well and being in contact with one side of the charge storage layer, a drain of the second conductivity type located in the third ion well and being in contact with another side of the charge storage layer, and an ion doped region of the second conductivity type formed under and surrounding the drain and penetrating through the third ion well and into the second ion well so as to electrically connect the drain and the second ion well.

According to the claimed invention, a low voltage single-poly flash memory array includes a deep ion well of a first conductivity type, a first ion well of the first conductivity type formed on the deep ion well, a second ion well of a second conductivity type formed on the deep ion well and being in contact with one side of the first ion well, a shallow ion well of the first conductivity type formed on the second ion well, a sector of memory cells including a plurality of memory cells, with each memory cell including a charge storage layer comprising a first insulating layer, a trapping layer, and a second insulating layer, located on the shallow ion well, a gate located on the charge storage layer, a source of the second conductivity type located in the shallow ion well and being in contact with one side of the charge storage layer, a drain of the second conductivity type located in the shallow ion well and being in contact with another side of the charge storage layer, and an ion doped region of the second conductivity type formed under and surrounding the drain and penetrating through the shallow ion well and into the second ion well so as to electrically connect the drain and the second ion well, a selection bit line device having a first end, a second end, and a gate end for controlling the corresponding sector of memory cells. The first end and the second end of the selection bit line device are formed within the first ion well, and the gate end is formed on the first ion well. An isolating region is formed between the selection bit line device and the corresponding sector of memory cells, a main bit line electrically connected to the first end of the selection bit line device, and a sub-bit line electrically connected to the second end of the selection bit line device and memory cells of the corresponding sector of memory cells.

These and other objectives of the claimed invention will no doubt become obvious to those of ordinary skill in the art after reading the following detailed description of the preferred embodiment that is illustrated in the various figures and drawings.

DETAILED DESCRIPTION

Figure 4:
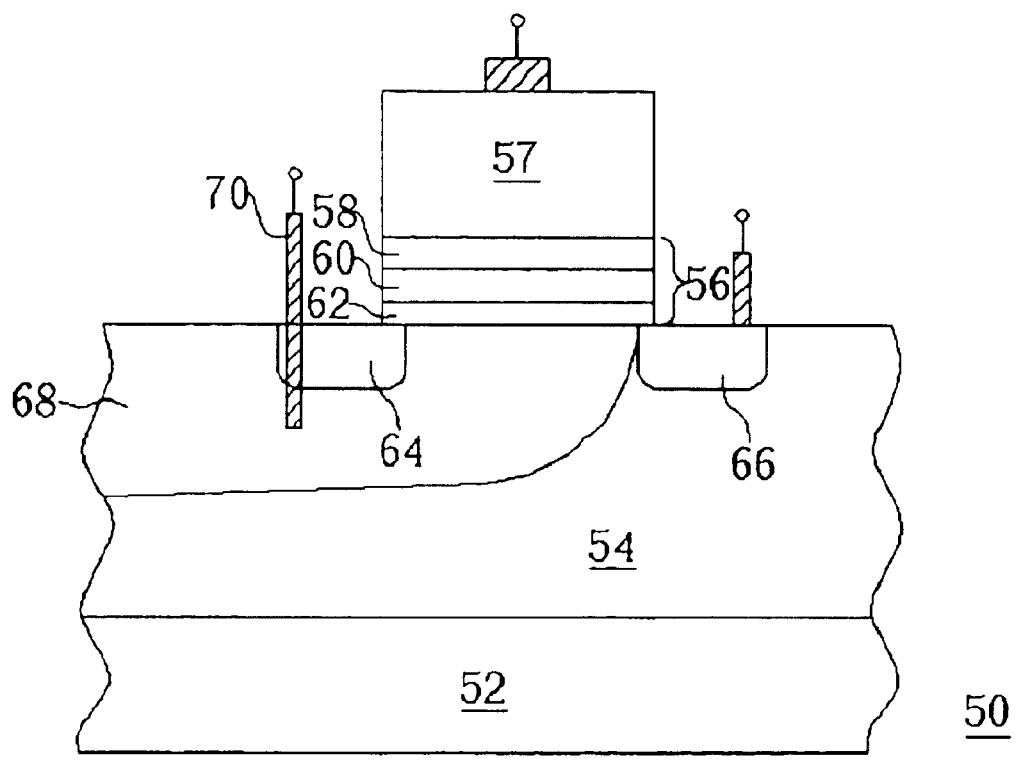
FIG. 4 is a cross-sectional diagram illustrating a flash memory cell according to the first embodiment of the present invention.

In order to solve the above-mentioned problems, another flash memory structure is provided to reduce desired operating voltage. FIG. 4 is a cross-sectional diagram illustrating a flash memory cell 50 according to the first embodiment of the present invention.

Please refer to FIG. 4. A deep P-well 52 in the flash memory cell 50 is utilized as a substrate of the flash memory cell 50. An N-well 54 is formed on the deep P-well 52, and a charge storage layer 56, from top to bottom, including an insulating layer 58, a trapping layer 60, and an insulating layer 62 islocated on the N-well 54. The insulating layers 58 and 60 are silicon oxide layers and the trapping layer 60 is a silicon nitride layer 60. A gate 57 is located on the charge storage layer 56, an N-type source 64 is located in the N-well 54 and is in contact with the charge storage layer 56, a P-type ion doped region 68 is formed in the N-well 54 and is under and surrounding the source 64 and at least a portion of a bottom of the insulating layer 62, and an N-type drain 66 is located in the N-well 54 and is in contact with the ion doped region 68 and the charge storage layer 56.

The drain 66 has a dosage larger than a dosage of the N-well 54. The flash memory cell 50 further includes a metal contact 70 that penetrates through the 64, and is electrically connected to the source 64 and the ion doped region 68. In addition, the metal contact 70 can only be electrically connected to the source 64 and the ion doped region 68, and does not penetrate through the source 64.

The operating method for operating the flash memory cell 50 is introduced below. First, during an erasing operation of the flash memory cell 50, a voltage of 3 to 7 Volts is applied to the gate 57, a voltage of −7 to −3 Volts lower than the gate voltage is applied to the drain 66, and the source 64 is in afloating state. During a programming operation of the flash memory cell 50, a voltage of −7 to −3 Voltsis applied to the gate 57, a voltage of 3 to 7 Volts higher than the gate voltage is applied to the source 64, and the drain 66 is in afloating state. During a reading operation of the flash memory cell 50, a voltage of 1 to 5 Voltsis applied to the gate 57, a voltage of 0.5 to 2 Volts is applied to the drain 66, and a voltage of 0 Volts is applied to the source 64.

Accordingly, the FN tunneling operating mode is induced to program and erase the flash memory cell 50. The flash memory 50 does not provide the electrons to form the channel current when the flash memory cell 50 is opened, so that the power consumption of the flash memory cell 50 is solved, and a lower operating voltage can be applied to the gate 57 and the drain 66 to program and erase the flash memory cell 50 more rapidly. For example, a voltage of about 3 Volts is applied to the gate 57 and a voltage of about −7 Volts is applied to the drain 66 so that an operating voltage of the flash memory cell 50 is about 10 Volts.

Figure 5:
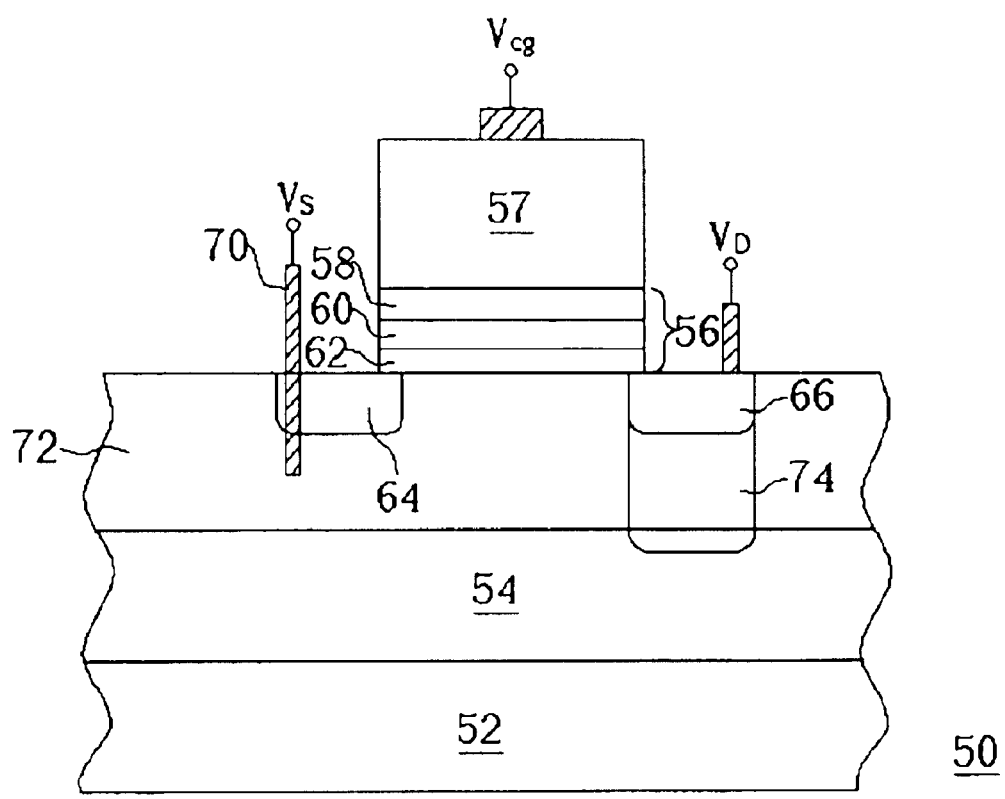
FIG. 5 is a cross-sectional diagram illustrating another flash memory cell according to the second embodiment of the present invention.

FIG. 5 is a cross-sectional diagram illustrating another flash memory cell 50 according to the second embodiment of the present invention. Please refer to FIG. 5. A deep P-well 52 in the flash memory cell 50 is utilized as a substrate of the flash memory cell 50. An N-well 54 is formed on the deep P-well 52, a shallow P-well 72 is formed on the N-well 54, and a charge storage layer 56, from top to bottom, including an insulating layer 58, a trapping layer 60, and an insulating layer 62 islocated on the shallow P-well 72. The insulating layers 58 and 60 are silicon oxide layers and the trapping layer 60 is a silicon nitride layer 60. A gate 57 is located on the charge storage layer 56, an N-type source 64 is located in the shallow P-well 72 and is in contact with one side of the charge storage layer 56, an N-type drain 66 is located in theshallow P-well 72 and is in contact with another side of the charge storage layer 56, and an N-type ion doped region 74 is formed under and surrounding the drain 66 and penetrating through the shallow P-well 72 and into the N-well 54 so as to electrically connect the drain 66 and the N-well 54.

The drain 66 has a dosage larger than a dosage of the N-well 54. The flash memory cell 50 further includes a metal contact 70 that penetrates through the 64, and is electrically connected to the source 64 and the shallow P-well 72. In addition, the metal contact 70 can be only electrically connected to the source 64 and the P-well 72, and does not have to penetrate through the source 64.

The operating method for operating the flash memory cell 50 is introduced below. First, during an erasing operation of the flash memory cell 50, a voltage of 3 to 7 Volts is applied to the gate 57, a voltage of −7 to −3 Volts lower than the gate voltage is applied to the drain 66, and the source 64 is in afloating state. During a programming operation of the flash memory cell 50, a voltage of −7 to −3 Voltsis applied to the gate 57, a voltage of 3 to 7 Volts higher than the gate voltage is applied to the source 64, and the drain 66 is in afloating state. During a reading operation of the flash memory cell 50, a voltage of 1 to 5 Voltsis applied to the gate 57, a voltage of 0.5 to 2 Volts is applied to the drain 66, and a voltage of 0 Volts is applied to the source 64.

Accordingly, the FN tunneling operating mode is induced to program or erase the flash memory cell 50. The flash memory 50 does not provide the electrons form the channel current when the flash memory cell 50 is opened, so that the power consumption of the flash memory cell 50 is solved, and a lower operating voltage can be applied to the gate 57 and the drain 66 to program and erase the flash memory cell 50 more rapidly. For example, a voltage of about 3 Volts is applied to the gate 57 and a voltage of about −7 Volts is applied to the drain 66 so that an operating voltage of the flash memory cell 50 is about 10 Volts.

Figure 6:
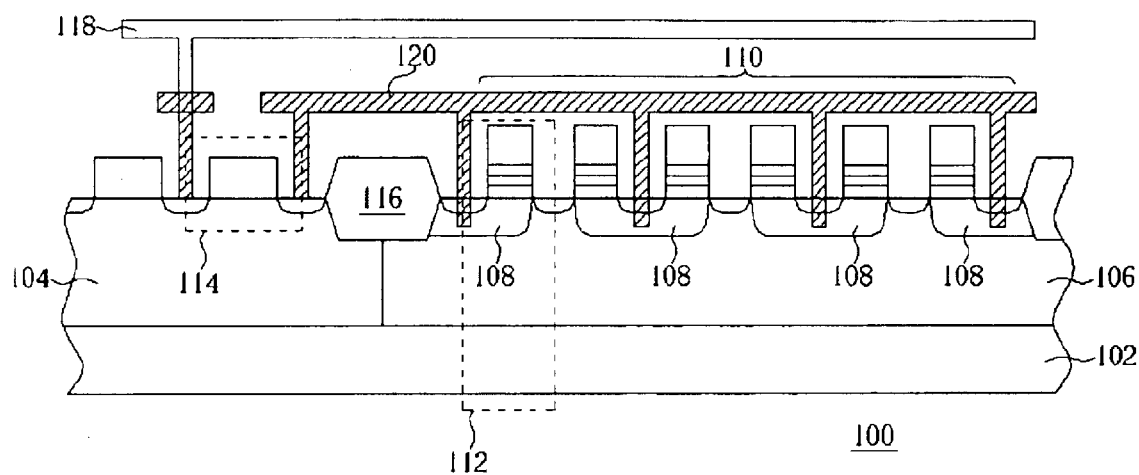
FIG. 6 is a cross-sectional diagram illustrating a flash memory array according to the first embodiment of the present invention.

FIG. 6 is a cross-sectional diagram illustrating a flash memory array according to the first embodiment of the present invention. Please refer to FIG. 6. The flash memory 100 includes a P-well 104 formed on a deep P-well 102, an N-well 106 formed on the deep P-well 102 and being in contact with the P-well 104, a shallow P-well 108 formed on the N-well 106, a sector of memory cells 110 including a plurality of memory cells 112, a selection bit line device 114 having a first end, a second end, and a gate end for controlling the corresponding sector of memory cells 110, and an isolating region 116 formed between the selection bit line device 114 and the corresponding sector of memory cells 110. The first end and the second end of the selection bit line device 114 are formed within the P-well 104 and the gate end of the selection bit line device 114 is formed on the P-well 104. A main bit line 118 is electrically connected to the first end of the selection bit line device 114, and a sub-bit line 120 is electrically connected to the second end of the selection bit line device 114 and each memory cell 112 of the corresponding sector of memory cells 110. Each memory cell 112 is shown in FIG. 5.

Figure 7:
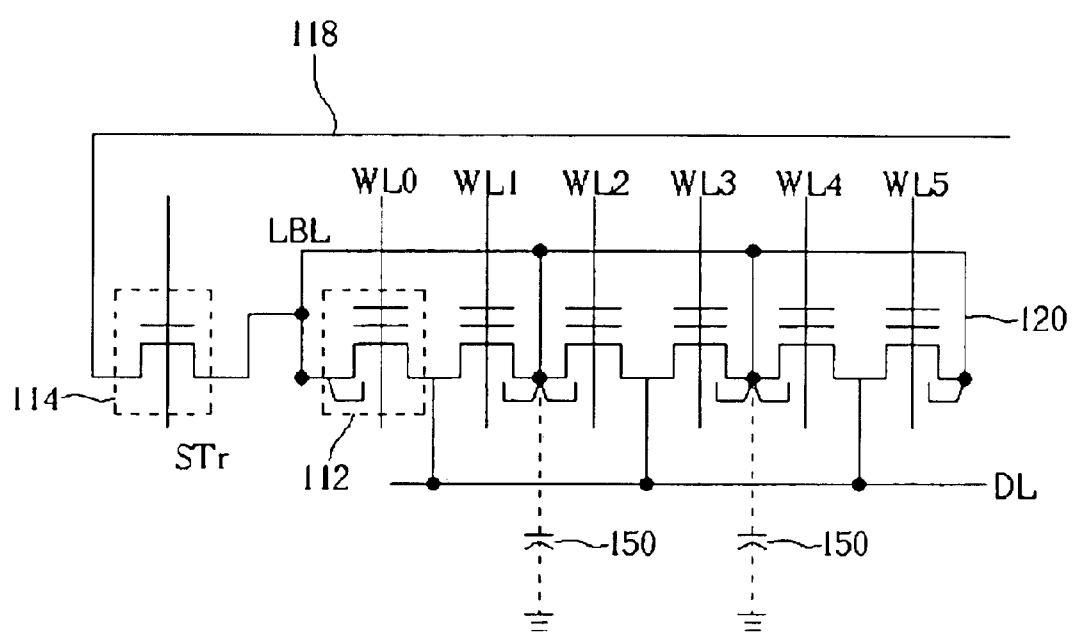
FIG. 7 is a corresponding circuit diagram shown in FIG. 6.

FIG. 7 is acorresponding circuit diagram shown in FIG. 6. The memory array composed of the plurality of the flash memory cells 112 shown in FIG. 6 can be represented as the circuit diagram shown in FIG. 7.

The flash memory 100 shown in FIG. 6 can prevent the problem ofoverloading of the bit line from happening. During a reading operation of the memory cell 112, the bit line selection device 114 is connected and another control bit line selection device (not shown) is disconnected, such that the sub-bit line 120 and the main bit line 118 have the same voltages, and another unselected sub-bit lines (not shown) are in a floating state. All of the flash memory cells in the other sectors, which are not in the selected sector, are not in an operating state. Therefore, any parasitic capacitance 150 shown in FIG. 7 and bit line loading are not generated in the other sectors, so that the loading of the main bit line 118 can be reduced when the flash memory is read.

Figure 1:
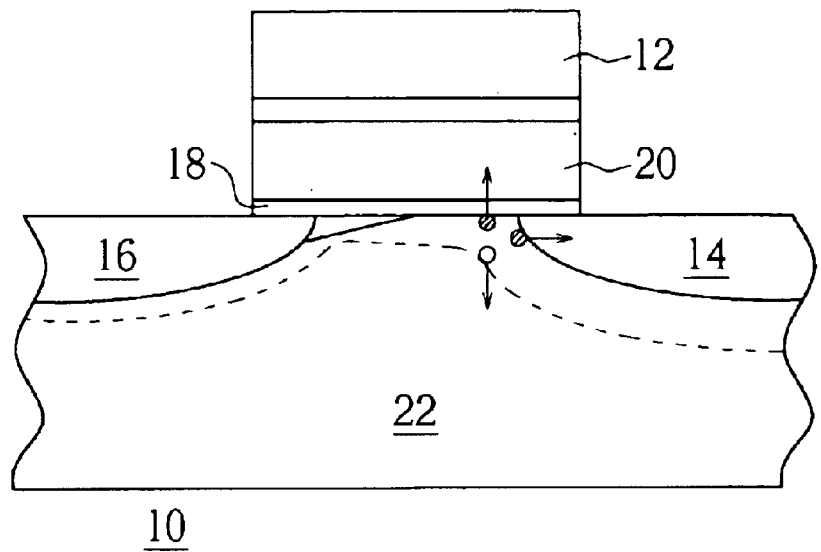
FIG. 1 is a schematic diagram illustrating a hot electron injection mode of a conventional flash memory cell.
Figure 2:
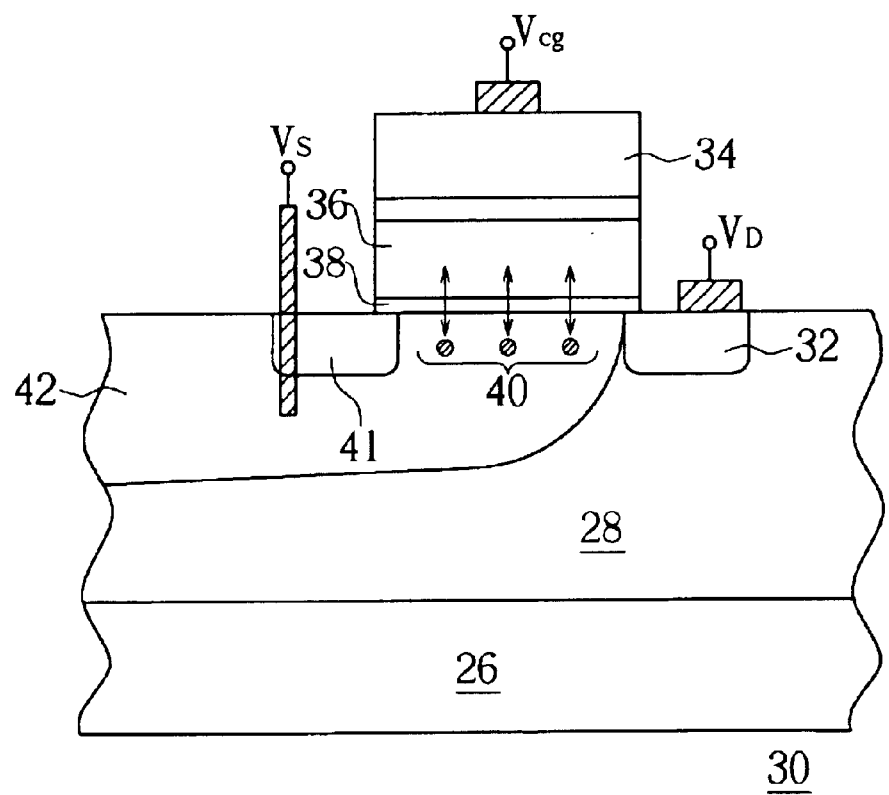
FIG. 2 is a cross-sectional diagram illustrating a FN tunneling mode of a conventional flash memory cell.
Figure 3A:
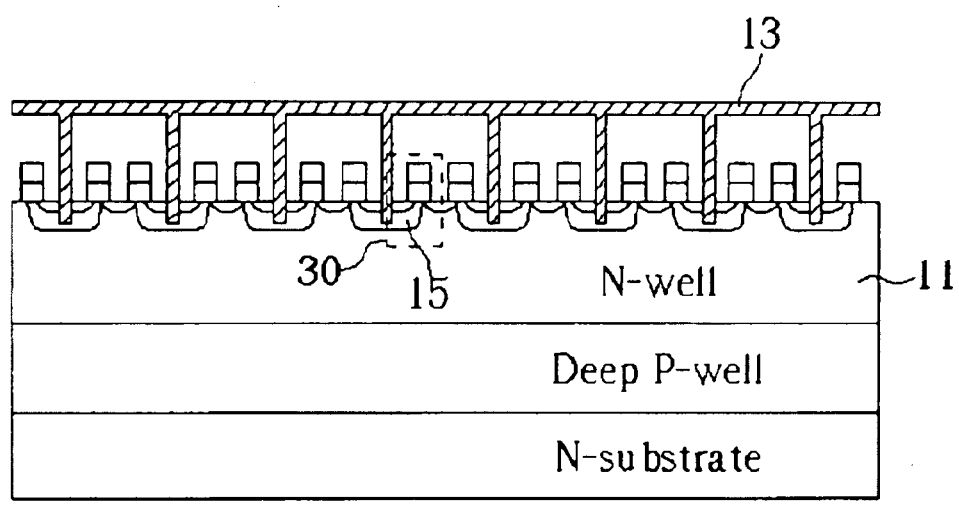
FIG. 3A is a cross-sectional diagram illustrating a bit line connection mode of a conventional flash memory cell.
Figure 3B:
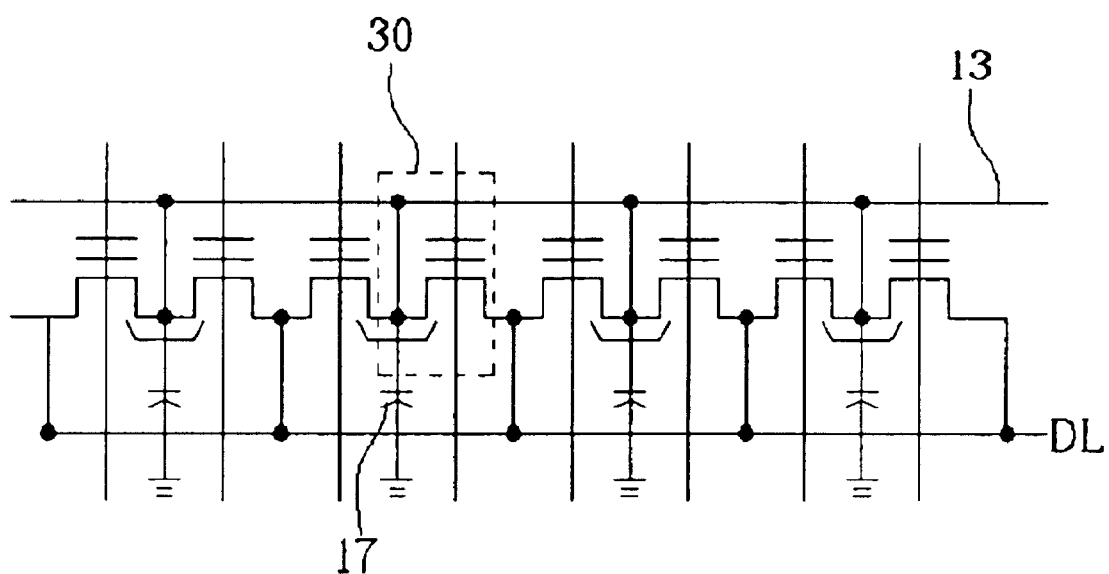
FIG. 3B is a corresponding circuit diagram shown in FIG. 3A.

The P-well 104 and N-well 106 are different from the single N-well 111 shown in FIG. 3 since the P-well 104 and the N-well 106 are formed side by side. The flash memory cell 112 is formed within the N-well 106, and the sector of memory cells 110 includes a plurality of the flash memory cells 112. In addition, only one or a plurality of sectors can be formed on the same N-well, such as two adjacent sectors of memory cells can be formed on the N-well 106. However, the selection bit line device 114 is formed within the P-well 104. The isolating region 116 is formed between the P-well 104 and the N-well 106 for isolating the flash memory cells 112 of each sector and the selection bit line device 114. The main bit line 118 is electrically connected to one end of the selection bit line device 114, and the sub-bit line 120 is electrically connected to the other end of the selection bit line device 114 and the source of each flash memory cell 112 of the corresponding sector of memory cells 110.

Further, the P-well 104 can be designed to isolate two N-wells. Each sector of memory cells 110 are formed in different N-wells 106 and the P-wells 104 to isolate each sector of memory cells 110. Therefore, the conventional interference of the bit line during the programming and the erasing operation of the flash memory, generated due to the single N-well 11 shown in FIG. 3A, will disappear. Only M−1 interferences of the bit line are generated in the N-well 106 when the flash memory is programmed so as to reduce the interferences.

The present invention solves the high power consumption and high operating voltage of the conventional flash memory cell, and utilizes only one polysilicon layer so as to simplify the process.

The flash memory cell of the present invention has a divided bit line. The main bit line and the sub-bit line are electrically connected to the selection bit line device so that the main bit line and the sub-bit line of the selected sector have the same voltage so as to prevent the overloading of the bit line from occurring.

The present invention utilizes the combination of the P-well and the N-well to replace the conventional single N-well, and the selection bit line device and the flash memory cells are formed on the P-well and the N-well, respectively. Therefore, each sector of memory cells are not formed on the same N-well so as to reduce the interferences of the bit line when the flash memory cell is programmed and erased.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A low voltage single-poly flash memory array comprising:
    a deep ion well of a first conductivity type;
    a first ion well of the first conductivity type formed on the deep ion well;
    a second ion well of a second conductivity type formed on the deep ion well and being in contact with the first ion well;
    a sector of memory cells comprising a plurality of memory cells, and each memory cell comprising:
        a charge storage layer comprising a first insulating layer, a trapping layer, and a second insulating layer, located on the second ion well;
        a gate located on the charge storage layer;
        a source of the second conductivity type located in the second ion well and being in contact with the charge storage layer;
        an ion doped region of the first conductivity type formed under and surrounding the source and at least a portion of a bottom of the first insulating layer; and
        a drain of the second conductivity type located in the second ion well and being in contact with the ion doped region and the charge storage layer;
    a selection bit line device having a first end, a second end, and a gate end for controlling the corresponding sector of memory cells, wherein the first end and the second end of the selection bit line device are formed within the first ion well, and the gate end is formed on the first ion well;
    an isolating region formed between the selection bit line device and the corresponding sector of memory cells;
    a main bit line electrically connected to the first end of the selection bit line device; and
    a sub-bit line electrically connected to the second end of the selection bit line device and memory cells of the corresponding sector of memory cells.

2. The low voltage single-poly flash memory array of claim 1 further comprising a metal contact that penetrates through the source.

3. The low voltage single-poly flash memory array of claim 1 further comprising a metal contact electrically connected with the source and the ion doped region.

4. The low voltage single-poly flash memory array of claim 1 wherein the first and the second insulating layers are silicon oxide layers.

5. The low voltage single-poly flash memory array of claim 1 wherein the trapping layer is a nitride layer.

6. A low voltage single-poly flash memory array comprising:
    a deep ion well of a first conductivity type;
    a first ion well of the first conductivity type formed on the deep ion well;
    a second ion well of a second conductivity type formed on the deep ion well and being in contact with one side of the first ion well;
    a shallow ion well of the first conductivity type formed on the second ion well;
    a sector of memory cells comprising a plurality of memory cells, and each memory cell comprising:
        a charge storage layer comprising a first insulating layer, a trapping layer, and a second insulating layer, located on the shallow ion well;
        a gate located on the charge storage layer;
        a source of the second conductivity type located in the shallow ion well and being in contact with one side of the charge storage layer;
        a drain of the second conductivity type located in the shallow ion well and being in contact with another side of the charge storage layer; and
        an ion doped region of the second conductivity type formed under and surrounding the drain and penetrating through the shallow ion well and into the second ion well so as to electrically connect the drain and the second ion well;
    a selection bit line device having a first end, a second end, and a gate end for controlling the corresponding sector of memory cells, wherein the first end and the second end of the selection bit line device are formed within the first ion well, and the gate end is formed on the first ion well;
    an isolating region formed between the selection bit line device and the corresponding sector of memory cells;
    a main bit line electrically connected to the first end of the selection bit line device; and
    a sub-bit line electrically connected to the second end of the selection bit line device and memory cells of the corresponding sector of memory cells.

7. The low voltage single-poly flash memory array of claim 6 further comprising a metal contact that penetrates through the source.

8. The low voltage single-poly flash memory array of claim 6 further comprising a metal contact electrically connected with the source and the shallow ion well.

9. The by voltage single-poly flash memory array of claim 6 wherein the first and the second insulating layers are silicon oxide layers.

10. The low voltage single-poly flash memory array of claim 6 wherein the trapping layer is a nitride layer.

11. A low voltage single-poly flash memory comprising:
    a sector of memory cells formed on a first ion well of a first conductivity type in a substrate of a second conductivity type, wherein each memory cell comprises an oxide-nitride-oxide (ONO) layer formed on the first ion well and a gate formed on the ONO layer;
    a second ion well of a second conductivity type formed on the substrate and being in contact with the first ion well; and
    a selection bit line device located within the second ion well and at one end of the sector of memory cells, wherein the selection bit line device has a first end electrically connected to a source of each of the memory cells through a sub-bit line and a second end electrically connected to a main bit line, and wherein the source of each of the memory cells consists of a first ion doped region of the first conductivity type and a second ion doped region of the second conductivity type that surrounds the first ion doped region and is short-circuited with the first ion doped region.

12. The low voltage single-poly flash memory of claim 11 wherein the selection bit line device further comprises a gate end located on the second ion well.

13. The low voltage single-poly flash memory of claim 11 wherein the first conductivity type is N type and the second conductivity type is P type.

14. The low voltage single-poly flash memory of claim 11 further comprising an isolating region disposed on the substrate between the selection bit line device and the sector of memory cells.

15. The low voltage single-poly flash memory of claim 11 wherein the short circuit connection between the first ion doped region and the second ion doped region of the source of each of the memory cells is obtained by using a metal contact that penetrates through a junction between the first ion doped region and the second ion doped region.

16. A low voltage single-poly flash memory comprising:

a first ion well of a first conductivity type formed in a substrate of a first conductivity type;

a second ion well of the second conductivity type formed on the substrate and being in contact with one side of the first ion well;

a third ion well of the first conductivity type formed on the second ion well;

a sector of memory cells comprising a plurality of memory cells formed on the third ion well, wherein each memory cell comprises an oxide-nitride-oxide (ONO) layer formed on the third ion well, a gate formed on the ONO layer, a source and a drain formed in the third ion well, and wherein an ion doped region is formed under and surrounds the drain so as to electrically connect the drain and the second ion well; and a selection bit line device located within the first ion well and at one end of the sector of memory cells, wherein the selection bit line device has a first end electrically connected to a source of each of the memory cells through a sub-bit line and a second end electrically connected to a main bit line.

17. The low voltage single-poly flash memory of claim 16 wherein the first conductivity type is P type and the second conductivity type is N type.

18. The low voltage single-poly flash memory of claim 16 wherein the source and the third well are short-circuited together by using a metal contact that penetrates through a junction between the source and the third well.

19. The low voltage single-poly flash memory of claim 16 wherein the selection bit line device further comprises a gate end located on the first ion well.

20. The low voltage single-poly flash memory of claim 16 further comprising an isolating region disposed on the substrate between the selection bit line device and the sector of memory cells.

* * * * *